United States Patent
Hammi et al.

(10) Patent No.: US 9,837,970 B2
(45) Date of Patent: Dec. 5, 2017

(54) BEHAVIORAL MODEL AND PREDISTORTER FOR MODELING AND REDUCING NONLINEAR EFFECTS IN POWER AMPLIFIERS

(71) Applicant: KING FAHD UNIVERSITY OF PETROLEUM AND MINERALS, Dhahran (SA)

(72) Inventors: Oualid Hammi, Sharjah (AE); Mohammed Hanzala Suleman Khan, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/061,954

(22) Filed: Mar. 4, 2016

(65) Prior Publication Data

US 2016/0261241 A1 Sep. 8, 2016

Related U.S. Application Data

(60) Provisional application No. 62/128,494, filed on Mar. 4, 2015.

(51) Int. Cl.
  *H03F 1/32* (2006.01)
  *H04B 1/04* (2006.01)
  *H03F 3/24* (2006.01)

(52) U.S. Cl.
  CPC ............ *H03F 1/3258* (2013.01); *H03F 3/24* (2013.01); *H04B 1/0475* (2013.01); *H03F 2200/102* (2013.01); *H03F 2201/3224* (2013.01); *H03F 2201/3233* (2013.01); *H04B 2001/0408* (2013.01)

(58) Field of Classification Search
  CPC ..................................................... H03F 1/3241
  USPC ........................................................ 330/149
  See application file for complete search history.

(56) References Cited

U.S. PATENT DOCUMENTS

| 5,349,539 A | 9/1994 | Moriyasu |
| 6,775,646 B1 | 8/2004 | Tufillaro et al. |
| 8,019,701 B2 * | 9/2011 | Sayyar-Rodsari ... G05B 13/042 706/12 |

(Continued)

OTHER PUBLICATIONS

Hammi, "Augmented Twin-Nonlinear Two-Box Behavioral Models for Multicarrier LTE Power Amplifiers," The Scientific World Journal, vol. 2014, Published Jan. 29, 2014.

*Primary Examiner* — Henry Choe
(74) *Attorney, Agent, or Firm* — Oblon, McClelland, Maier & Neustadt, L.L.P.

(57) ABSTRACT

The behavioral model and predistorter for modeling and reducing nonlinear effects in power amplifiers addresses the model size estimation problem. The GMP model is replaced by the hybrid memory polynomial/envelope memory polynomial (HMEM) model within a twin nonlinear two-box structure to reduce the number of variables involved in the model size estimation problem, without compromising model accuracy and digital predistorter performance. A sequential approach is presented to efficiently estimate the model size. Experimental validation is carried out to evaluate the performance of the size estimation and the accuracy of the HMEM-based twin-nonlinear two-box model with respect to that of the GMP-based twin-nonlinear two-box model.

10 Claims, 9 Drawing Sheets

(56) References Cited

U.S. PATENT DOCUMENTS

| | | | | |
|---|---|---|---|---|
| 8,078,561 B2* | 12/2011 | Liu | ................... | H03F 1/3258 |
| | | | | 706/46 |
| 8,620,631 B2* | 12/2013 | Al-Duwaish | ............ | G06N 7/08 |
| | | | | 703/2 |
| 8,666,336 B1 | 3/2014 | Dick | | |
| 2015/0043678 A1 | 2/2015 | Hammi | | |
| 2015/0162881 A1 | 6/2015 | Hammi | | |

* cited by examiner

BEHAVIORAL MODEL AND PREDISTORTER FOR MODELING AND REDUCING NONLINEAR EFFECTS IN POWER AMPLIFIERS

CROSS-REFERENCE TO RELATED APPLICATION

This application claims the benefit of U.S. Provisional Patent Application Ser. No. 62/128,494, filed Mar. 4, 2015.

BACKGROUND OF THE INVENTION

1. Field of the Invention

The present invention relates to power amplifier circuits and radio frequency transmitter systems, and particularly to a behavioral model and predistorter for modeling and reducing nonlinear effects in power amplifiers, the behavioral model and predistorter function having a sequential method for efficiently estimating its size.

2. Description of the Related Art

Recent advances in modern communication and broadcasting applications have led to the development of spectral-efficient modulation and access techniques that unavoidably result in time domain signals having strong envelope fluctuations. This amplitude modulation of communication and broadcasting signals allows for the transmission of higher data rates at the expense of stringent linearity requirements at the radiofrequency (RF) front end. The need for linearity is mainly motivated by two major concerns, including avoiding spectrum regrowth to minimize inter-channel interference, and reducing in-band error to maintain the signal quality while limiting the error vector magnitude at the transmitter and the bit error rate at the receiver.

Signal distortions at the RF front end result primarily from the nonlinear distortions of power amplifiers. These distortions are commonly compensated for at the transmitter using the baseband digital predistortion technique. Digital predistortion consists of implementing, before the power amplifier (PA), a nonlinear function that is complementary to that of the PA so that the cascade composed of the digital predistorter (DPD) and the PA operates as a linear amplification system. The wide adoption of digital predistortion increased the importance of modeling the nonlinear behavior of power amplifiers. Indeed, digital predistortion is a behavioral modeling problem in which the input and output of the system are swapped.

Moreover, behavioral modeling is essential for system-level simulations and the assessment of the expected linearity performance of an amplifier and a transmitter. Numerous behavioral modeling and digital predistortion structures have been proposed to accurately model and compensate for the dynamic nonlinear behavior of power amplifiers using memory polynomial (MP), two-box based structures, Volterra series, and neural networks.

In modern applications, high-efficiency power amplification structures, such as Doherty power amplifiers and envelope tracking power amplifiers, are of prime interest. These amplifier circuits often result in strongly nonlinear dynamic behavior, especially when they are driven with wideband modulated signals. This calls for the use of multi-basis functions memory polynomial structures involving dynamic nonlinear cross-terms, such as the generalized memory polynomial (GMP) model. Unfortunately, the performance gain achieved by the generalized memory polynomial model comes at the expense of a high complexity due to its large number of coefficients. To circumvent this limitation, the GMP model was applied within a twin-nonlinear two-box structure to reduce the total size of the model coefficients while maintaining its accuracy. However, one challenge is still associated with the GMP-based two-box model. This challenge is related to the evaluation of the model size, which involves determining eight parameters, including nonlinearity orders, memory depths, and leading and lagging cross-terms orders. In fact, it is essential to accurately estimate the size of the model in order to avoid suboptimal performance due to model under-sizing, and unnecessary computational load and numerical stability issues due to model over-sizing.

Thus, a behavioral model and predistorter for modeling and reducing nonlinear effects in power amplifiers solving the aforementioned problems is desired.

SUMMARY OF THE INVENTION

The behavioral model and predistorter for modeling and reducing nonlinear effects in power amplifiers addresses the model size estimation problem. The GMP (generalized memory polynomial) model is replaced by the hybrid memory polynomial/envelope memory polynomial (HMEM) model within the twin nonlinear two-box structure to reduce the number of variables involved in the model size estimation problem without compromising the model accuracy and the digital predistorter performance. A sequential approach is also presented to efficiently estimate the model size.

Experimental validation is carried out to evaluate the performance of the present size estimation and the accuracy of the HMEM-based twin-nonlinear two-box model with respect to that of the GMP-based twin-nonlinear two-box model.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

At the outset, it should be understood by one of ordinary skill in the art that embodiments of the present system can comprise software or firmware code executing on a computer, a microcontroller, a microprocessor, a programmable gate array, or a DSP processor; state machines implemented in application specific or programmable logic; or numerous other forms without departing from the spirit and scope of the present method. The present system can be provided as a computer program, which includes a non-transitory machine-readable medium having stored thereon instructions that can be used to program a computer (or other electronic devices) to perform a process according to the process described herein. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

The behavioral model and predistorter for modeling and reducing nonlinear effects in power amplifiers addresses the model size estimation problem. The GMP (generalized memory polynomial) model is replaced by the hybrid memory polynomial/envelope memory polynomial (HMEM) model within a twin nonlinear two-box structure to reduce the number of variables involved in the model size estimation problem without compromising the model accuracy and the digital predistorter performance. A sequential approach is also presented to efficiently estimate the model size.

Experimental validation is carried out to evaluate the performance of the present size estimation and the accuracy of the HMEM-based twin-nonlinear two-box model with respect to that of the GMP-based twin-nonlinear two-box model.

Figure 3:
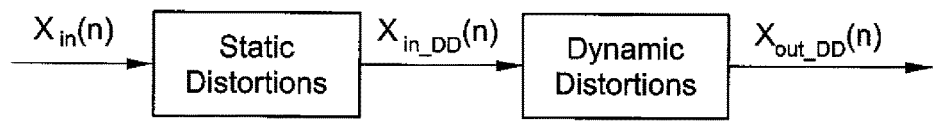
FIG. 3 is a block diagram illustrating a forward twin-nonlinear two-box model.
Figure 4A:
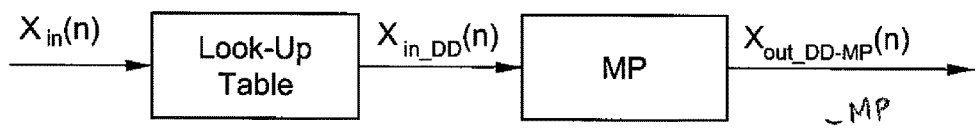
FIG. 4A is a block diagram illustrating a forward twin-nonlinear two-box model with lookup table and MP (memory polynomial).

Two-box models, such as the FTNTB (forward twin-nonlinear two-box) model 300 illustrated in FIG. 3, enable the separation of highly nonlinear static distortions and mildly nonlinear dynamic distortions, which results in significant reduction of the model size (i.e., number of coefficients). The forward twin-nonlinear two-box model 300 is composed of the cascade of a static nonlinear function circuit and a dynamic nonlinear function circuit. The static nonlinear function is commonly implemented as a look-up table, although a memoryless polynomial function can be used to implement the static distortion part of the FTNTB model 300. In its conventional version, the dynamic nonlinear distortions function is built using a memory polynomial (MP) block 400a (shown in FIG. 4A). In this case, the signals $x(n)$ and $x_{out\_DD}(n)$ are related according to:

$$x_{out\_DD}(n) = \sum_{j=1}^{M} \sum_{i=1}^{N} a_{ji} \cdot x_{in\_DD}(n+1-j) \cdot |x_{in\_DD}(n+1-j)|^{i-1}, \quad (1)$$

where N is the nonlinearity order of the model, M is the model's memory depth, and $a_{ji}$ are the model coefficients. Therefore, the size of the memory polynomial model is:

$$S_{MP} = N \times M \quad (2)$$

Figure 4B:
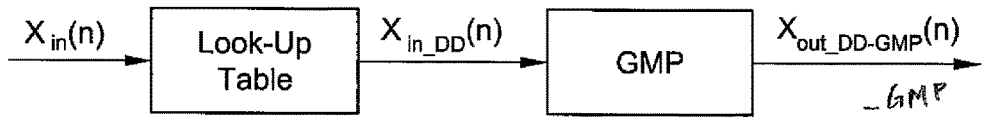
FIG. 4B is a block diagram illustrating a forward twin-nonlinear two-box model with lookup table and GMP (generalized memory polynomial).

To improve the performance of this model in the context of modern power amplifiers exhibiting strongly nonlinear dynamic behaviors, the GMP model 400b (shown in FIG. 4B) was used to model the dynamic nonlinear distortions in the twin-nonlinear two-box model. In such a case, the signal $x_{out\_DD}(n)$ is expressed as a function of the signal $x(n)$ according to:

$$x_{out\_DD}(n) = \qquad (3)$$

$$\sum_{j=1}^{M} \sum_{i=1}^{N} a_{ji} \cdot x_{in\_DD}(n+1-j) |x_{in\_DD}(n+1-j)|^{i-1} +$$

$$\sum_{j=1}^{M_b} \sum_{i=1}^{N_b} \sum_{l=1}^{L_b} b_{jil} \cdot x_{in\_DD}(n+1-j) |x_{in\_DD}(n+1-j-l)|^{i} +$$

$$\sum_{j=1}^{M_c} \sum_{i=1}^{N_c} \sum_{l=1}^{L_c} c_{jil} \cdot x_{in\_DD}(n+1-j) |x_{in\_DD}(n+1-j+l)|^{i}$$

where $a_{ji}$, $b_{jil}$, and $c_{jil}$ represent the model coefficients of the time-aligned, lagging cross-terms and leading cross-terms branches, respectively. M, $M_b$, and $M_c$ are the memory depths associated with the time-aligned, lagging cross-terms and leading cross-terms memory polynomial functions, respectively. Similarly, N, $N_b$, and $N_c$ are the nonlinearity orders associated with the time-aligned, lagging cross-terms and leading cross-terms memory polynomial functions, respectively. $L_b$ and $L_c$ are the model's maximum lagging and leading cross-term orders, respectively. As can be inferred from (3), the size of the GMP model is given by:

$$S_{GMP} = (N \times M) + (N_b \times M_b \times L_b) + (N_c \times M_c \times L_c). \quad (4)$$

Figure 4C:
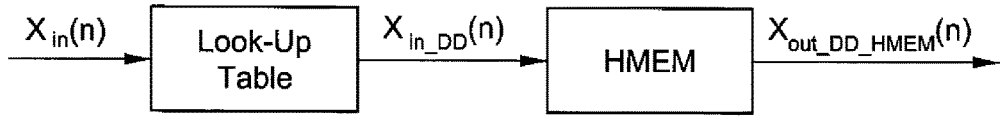
FIG. 4C is a block diagram illustrating a forward twin-nonlinear two-box model with lookup table and HMEM (hybrid memory polynomial/envelope memory polynomial).

Accordingly, estimating the size of the GMP model requires determining the value of the eight parameters (N, M, $N_b$, $M_b$, $L_b$, $N_c$, $M_c$ and $L_c$). Therefore, the hybrid memory polynomial/envelope memory polynomial model (HMEM) shown in FIG. 4C is considered. By implementing the dynamic nonlinear distortions function using the HMEM model, the signal $x_{out\_DD}(n)$ will be given by:

$$x_{out\_DD}(n) = \qquad (5)$$

$$\sum_{j=1}^{M} \sum_{i=1}^{N} a_{ji} \cdot x_{in\_DD}(n+1-j) \cdot |x_{in\_DD}(n+1-j)|^{i-1} +$$

$$\sum_{j=1}^{M_E} \sum_{i=1}^{N_E} b_{ji} \cdot x_{in\_DD}(n) \cdot |x_{in\_DD}(n+1-j)|^{i-1}$$

where N and M represent the nonlinearity order and memory depth of the memory polynomial sub-function, respectively. Similarly, $N_E$ and $M_E$ refer to the nonlinearity order and memory depth of the envelope memory polynomial sub-function, respectively. Means for computing the HMEM model output signal $x_{out\_DD}(n)$ may include, but not be limited to, any suitable computation means, such as the aforementioned computer, microcontroller, microprocessor, programmable gate array, DSP processor; state machines implemented in application specific or programmable logic, and the like.

The use of the HMEM model instead of the GMP model for the dynamic nonlinear distortions block is mainly motivated by the fact that the size of the HMEM model only depends on four variables as given in equation (6), which represents 50% fewer variables when compared to the case of the GMP model. This significantly reduces the complexity associated with the model size estimation, as will be discussed below.

$$S_{HMEM} = (N \times M) + (N_E \times M_E) \quad (6)$$

With respect to model size estimation, the model size is typically determined by minimizing a cost function, such as the normalized mean squared error (NMSE), the Akaike Information Criterion (AIC), or the Bayesian Information Criterion (BIC) cost functions. This implies that the model size is swept, and the cost function is evaluated for each model size. In the case of the AIC and BIC, the minimum value corresponds to the model size to be selected. Conversely, for the NMSE, the gradient is typically used to select the model size that corresponds to the best trade-off between performance and complexity. While this model size estimation problem looks simple at first glance, closer inspection reveals that there are some challenges due to the fact that the total model size is defined using multiple variables (2 in the case of MP, 8 for GMP, and 4 for HMEM). This means that the optimization problem to be solved in order to determine the model's size becomes multi-dimensional, and thus more difficult to solve. Moreover, mapping back the size of the model into the values of its different parameters, i.e., ($N$, $M$, $M_E$, and $N_E$) for the case of the HMEM, is not straightforward, since one model size can be obtained by many different combinations of parameter values. For example, a total size of sixteen for the HMEM model can be obtained for ($N$, $M$, $M_E$, and $N_E$), when it is equal to $\{4, 2, 4, 2\}$ or $\{5, 3, 1, 1\}$, etc. This means that even if the total model size is found, there exists the combinatorial problem of picking the 'best' pair, which is difficult to solve efficiently. Putting this in perspective, the optimum dimensions for GMP would be extremely difficult to find through traditional means. Therefore, despite its ability to achieve high accuracy, the use of the GMP model is quite hindered by the model size identification aspect. Thus, it is essential to reduce the complexity of this problem and come up with an efficient technique to solve it. For this purpose, the HMEM model is used to replace the GMP model in the two-box twin-nonlinear configuration. The main advantage of this is to reduce the number of model parameters from eight for the GMP to four in the case of the HMEM. A sequential approach is then devised to efficiently determine the model size and the value of its parameters. Finally, the impact of replacing the GMP by the HMEM on digital predistorter performance is experimentally evaluated.

Figure 2:
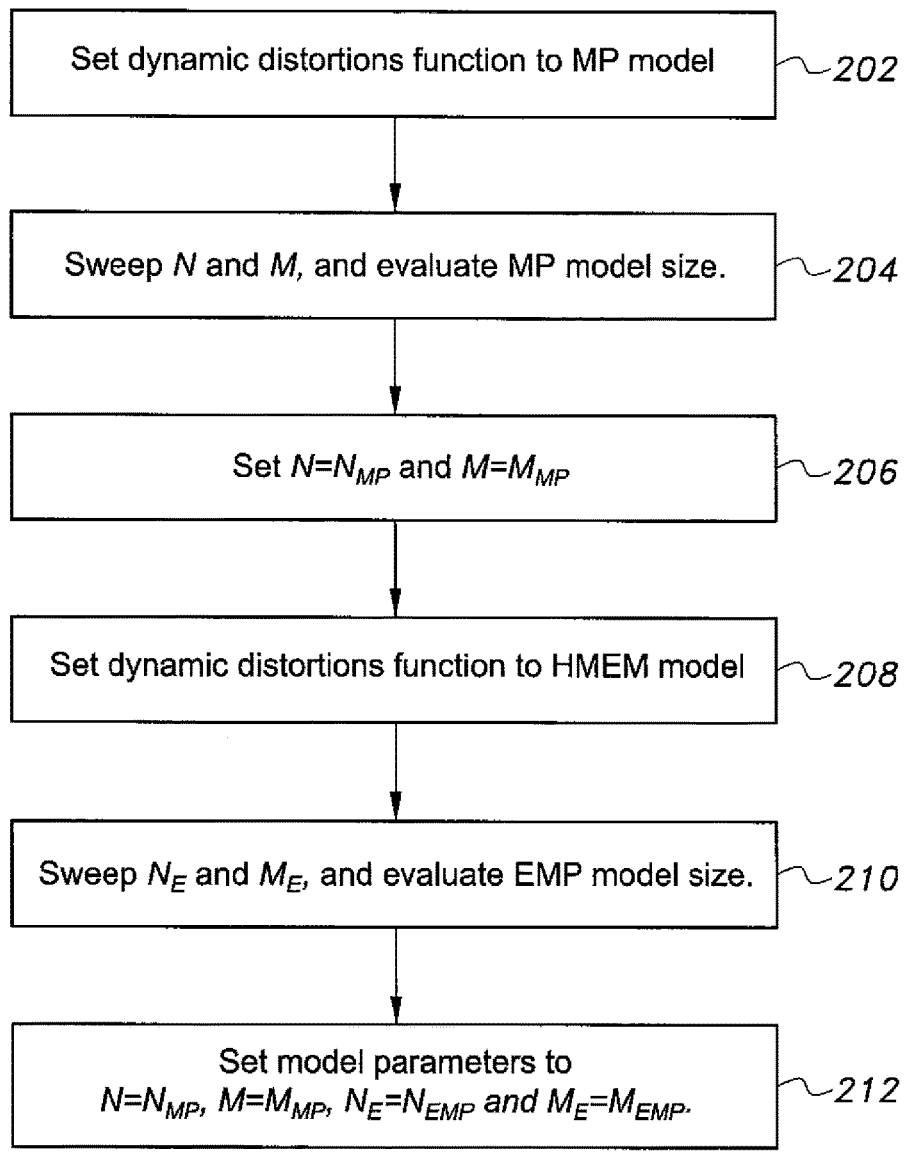
FIG. 2 is a flowchart illustrating the sequential model size estimation method in behavioral model and predistorter for modeling and reducing nonlinear effects in power amplifiers according to the present invention.

The hybrid memory polynomial/envelope memory polynomial model is made of the parallel combination of two polynomial functions. It can be perceived as a memory polynomial model augmented with the addition of a second basis function that introduces extra-cross terms, as can be observed through equation (5). Taking this aspect into account, the sequential model size estimation method includes two steps. It estimates the size of the memory polynomial sub-model, and then it estimates the size of the envelope memory polynomial sub-model. The flowchart 200 of the sequential method is depicted in FIG. 2. At step 202, the dynamic distortions function is set to that of the memory polynomial. At step 204, the nonlinearity order and the memory depth of the memory polynomial are swept, and for each set of values, model performance is evaluated. This step leads to the identification (at step 206) of the appropriate nonlinearity order and memory depth of the memory polynomial function ($N_{MP}$ and $M_{MP}$). Then, at step 208, the dynamic distortions function is set to that of the HMEM function, where the nonlinearity order and memory depth of the memory polynomial sub-function are set to their previously estimated values, i.e., $N=N_{MP}$ and $M=M_{MP}$. At step 210, the nonlinearity order and memory depth $M_E$, and $N_E$ of the envelope memory polynomial are swept, and for each value, model performance is assessed to determine the size of the envelope memory polynomial sub-model of the HMEM model. At step 212, the model parameters are set to $N=N_{MP}$ and $M=M_{MP}$, $N_E=N_{EMP}$ and $M_E=M_{EMP}$. By decoupling the estimation of the four parameters into two successive steps, in each of which only two parameters are identified, the present technique significantly reduces the computational complexity associated with model size estimation. During the parameters sweep, model performance assessment can be done using the AIC, the BIC, or the NMSE. In developing the present method, each of the two variables were concurrently swept and the NMSE was evaluated as a function of the model size. As mentioned earlier, since more than one set of coefficients can lead to the same model size, the minimum NMSE was considered for each model size and used to identify the appropriate size, beyond which the NMSE improvement becomes marginal. The size was then mapped back to find the corresponding nonlinearity order and memory depth.

By successively sweeping only two variables at a time, the present method considerably reduces the total number of iterations needed to identify the model size to:

$$\text{Iterations}_{HMEM\_Succ} = [(N_{max} - N_{min} + 1) \times (M_{max} - M_{min} + 1)] + [(N_{Emax} - N_{Emin} + 1) \times (M_{Emax} - M_{Emin} + 1)] \quad (7)$$

where the indices "min" and "max" denote the minimum and maximum values delimiting the sweep range of each variable, respectively. Conversely, using the conventional approach, in which all four variables are swept concurrently, will lead to a total number of iteration given by:

$$\text{Iterations}_{HMEM\_Conc} = [(N_{max} - N_{min} + 1) \times (M_{max} - M_{min} + 1)] \times [(N_{Emax} - N_{Emin} + 1) \times (M_{Emax} - M_{Emin} + 1)] \quad (8)$$

where all variables are the same as in Equation (7).

Considering equations (7) and (8), it is clear that if ten possible values are considered for each parameter defining the model size, then the number of iterations needed in the proposed successive sweep will be 200, while the conventional concurrent sweep approach would require 10,000 iterations. In general, if the sweep range has R values for each variable, then the proposed approach would require a maximum of $2R^2$ iterations, in contrast with $R^4$ iterations for the concurrent sweep. Reducing the number of sweeps does not impact the performance of the model and its accuracy.

It is worth mentioning here that the proposed technique can be further extended to the identification of the generalized memory size. In such case, one possible approach would be to perform the sweep in two steps, first for the memory polynomial sub-model, then for both leading and lagging cross-terms. A second approach consists of estimating the sizes of the leading and lagging cross-terms functions in two different steps. However, as can be observed in the experimental results section, the hybrid memory polynomial-based TNTB model leads to performances comparable to that of the GMP-based TNTB model. It should be understood that means for performing computation of the sequential model size estimation technique may include any suitable computation means, including, but not limited to, the aforementioned computer, microcontroller, microprocessor, programmable gate array, DSP processor, state machines implemented in application specific or programmable logic, and the like.

Figure 1:
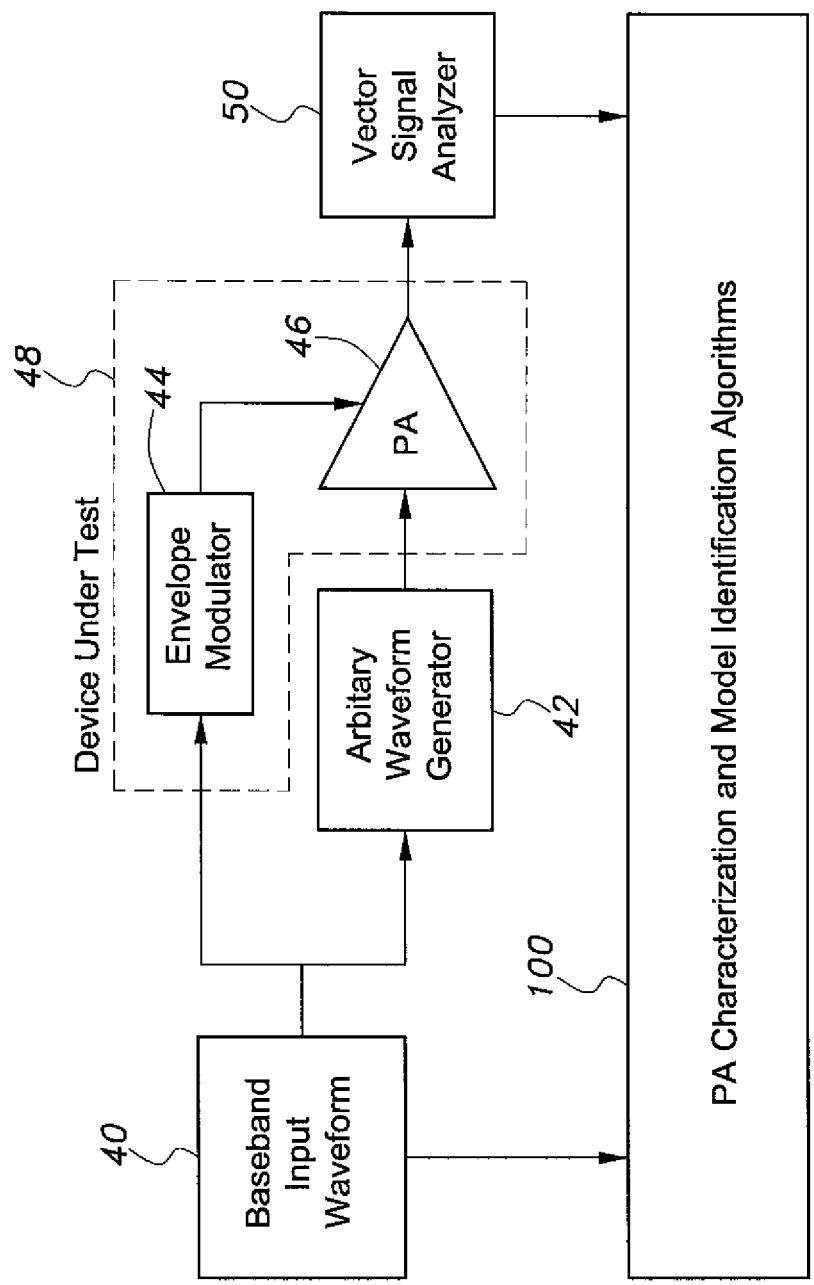
FIG. 1 is a block diagram illustrating the experimental setup for DUT (device under test) characterization.
Figure 4D:
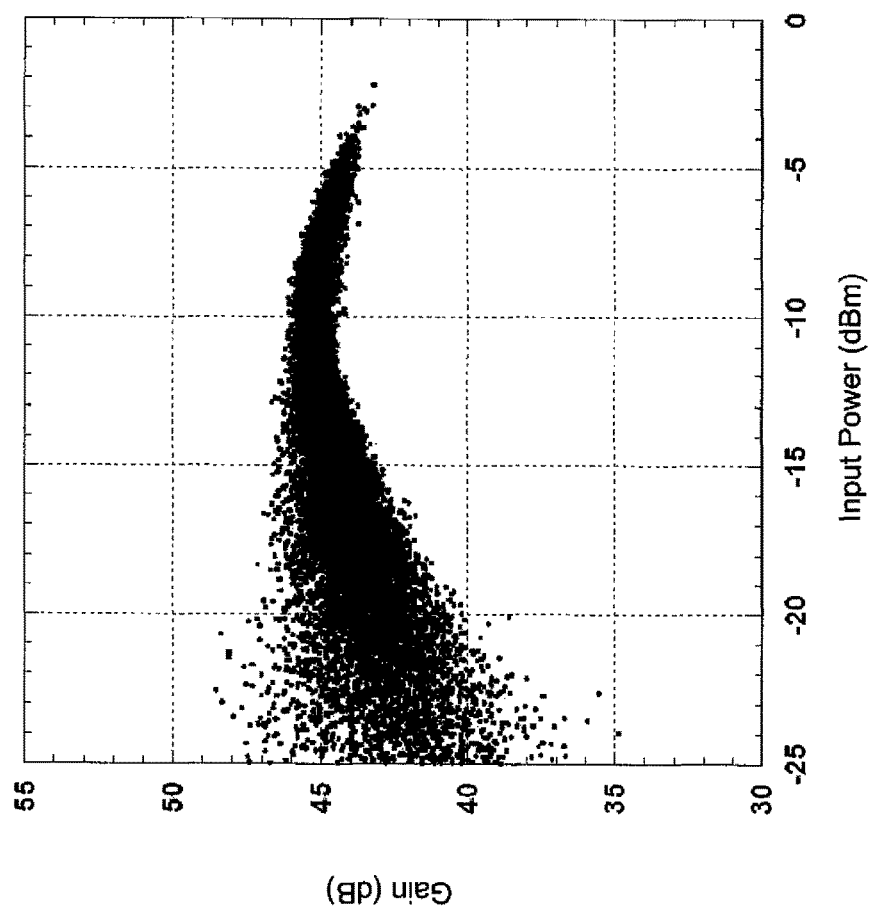
FIG. 4D is a plot illustrating measured AM/AM characteristics.
Figure 4E:
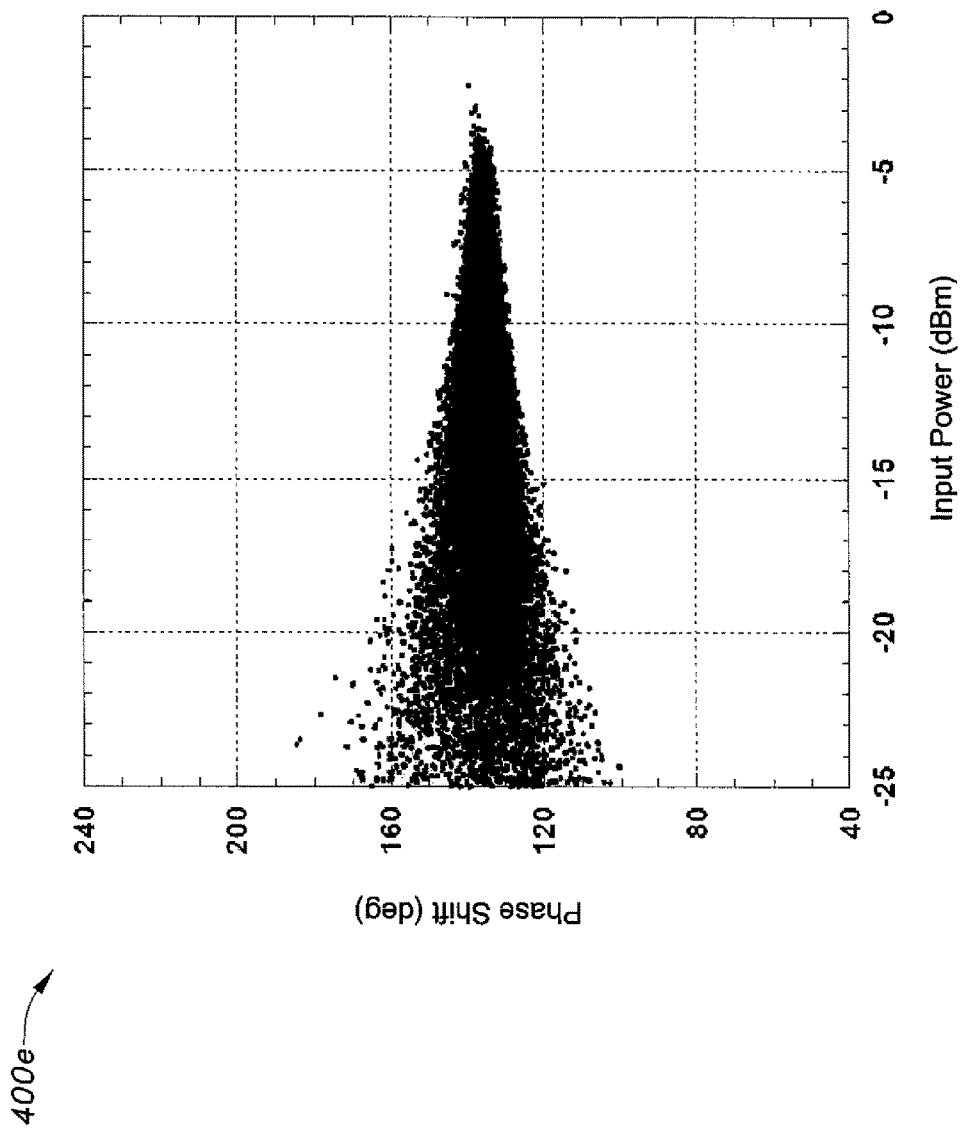
FIG. 4E is a plot illustrating measured AM/PM characteristics.

The present method was experimentally validated using an envelope tracking power amplifier (ETPA). The device under test (DUT 48), shown in FIG. 1, is built with gallium nitride transistors and is harmonically tuned for high efficiency around a carrier frequency of 2425 MHz. The ETPA was characterized using a 4-carrier long term evolution (LTE) test signal having a peak-to-average power ratio (PAPR) of 9.7 dB and a total bandwidth of 18 MHz. The experimental setup used for the characterization of the envelope tracking power amplifier is illustrated in FIG. 1. First, the baseband input waveform 40 is downloaded into an arbitrary waveform generator 42 to synthesize the modulated RF signal that will be applied at the input of the power amplifier 46. To ensure the envelope tracking operation, a copy of the baseband input waveform is applied at the input of the envelope modulator 44 that will generate the variable DC supply voltage to be applied at the drain of the power amplifier 46. The output of the power amplifier is fed into a vector signal analyzer 50 to obtain the baseband output waveform associated with the DUT's RF output. The input and output baseband waveforms are then processed by the present PA characterization and model identification algorithms 100 to perform time and power alignments. The DUT's AM/AM and AM/PM characteristics are reported in plot 400d of FIG. 4D and plot 400e of FIG. 4E, respectively. These figures show the effect of the envelope tracking operation, which introduces nonlinear distortions at low input power levels, as well as significant dispersion over the entire power range.

Figure 5A:
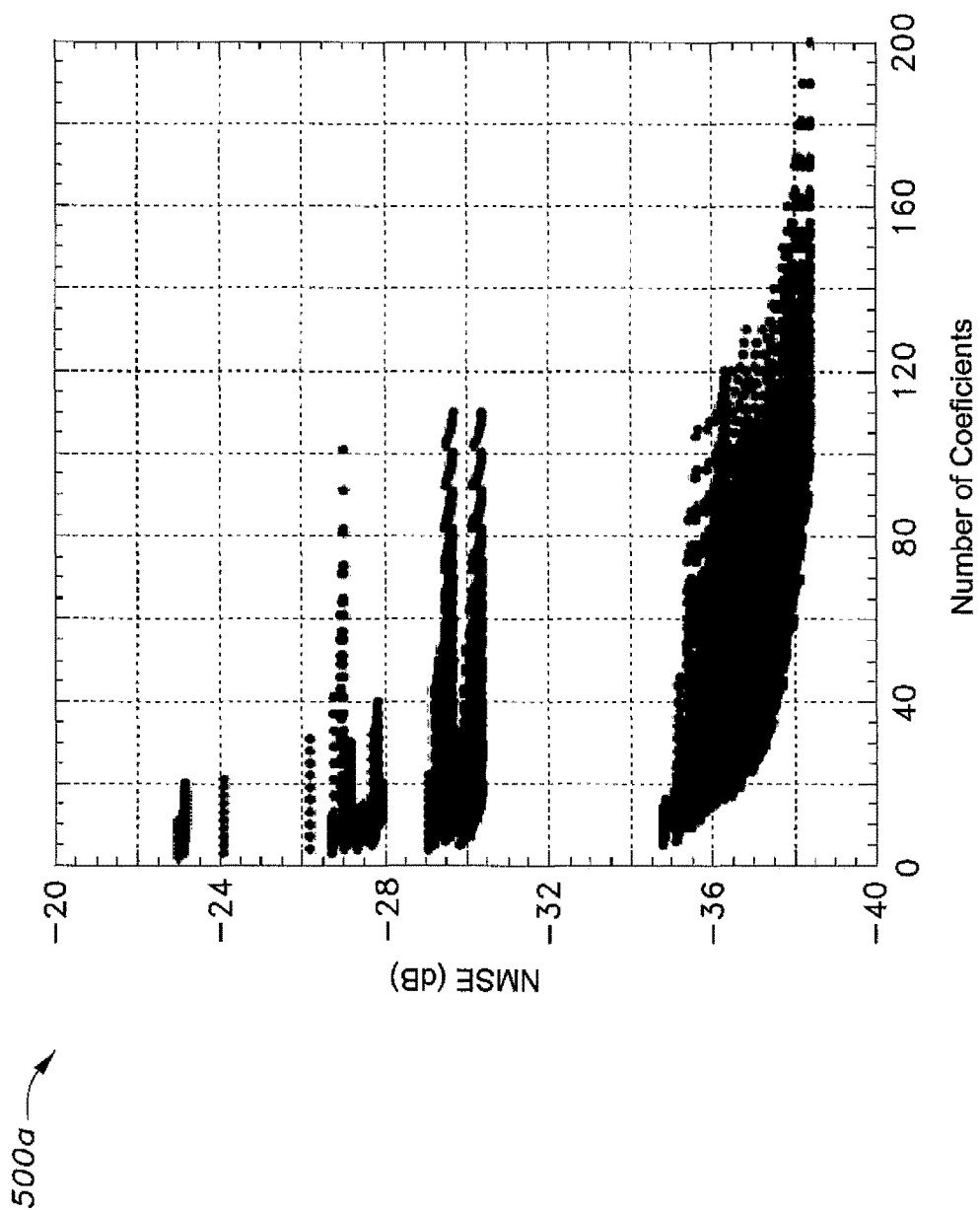
FIG. 5A is a plot illustrating raw data NMSE results.
Figure 5B:
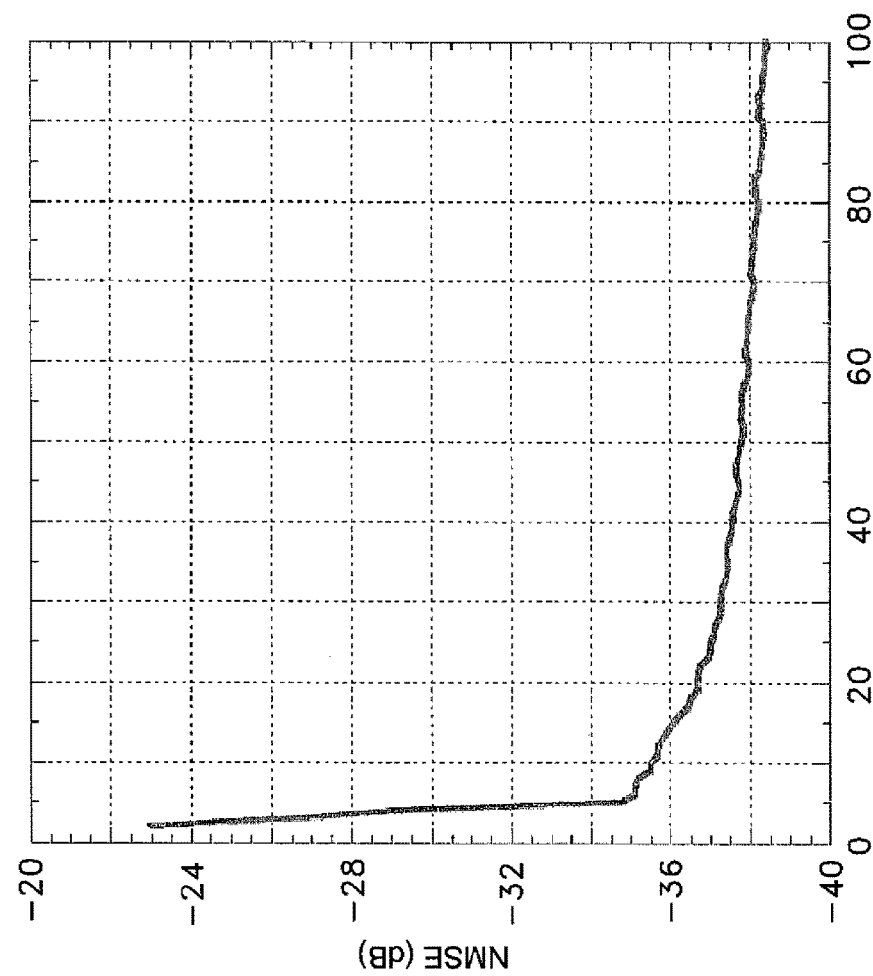
FIG. 5B is a plot illustrating minimum NMSE data.

To assess the ability of the present model size estimation approach, the twin-nonlinear two-box model was used to model the device under test behavior. First, the measured data was used to extract the static distortion sub-function of the model, and then the measurement data was de-embedded to the input and output planes of the dynamic distortions block. The hybrid memory polynomial envelope memory polynomial was used to model the dynamic distortions of the DUT. A concurrent sweep of all the model parameters was first performed in order to establish a benchmark and determine the best possible NMSE for each model size. For this purpose, N, M, $N_E$, and $M_E$ were all swept from 1 to 10 in steps of 1. This gave rise to 10,000 possible combinations, for each of which the HMEM model was identified. The normalized mean square error between the model's predicted and desired output was also calculated for each of the 10,000 combinations using the following equation:

$$NMSE_{dB} = 10\log_{10}\sqrt{\frac{\sum_{l=1}^{L}|x_{out\_meas}(l)-x_{out\_DD}(l)|^2}{\sum_{l=1}^{L}|x_{out\_meas}(l)|^2}}. \quad (9)$$

where $x_{out\_meas}$ and $x_{out\_DD}$ are the measured and estimated baseband output waveforms at the output of the device under test, and L is the number of samples in the output waveform. The NMSE calculated for all possible combinations of the concurrent sweep is reported in plot 500a of FIG. 5A. To better illustrate the potential of the model, the best NMSE (i.e., lowest value) was derived for each model dimension. This was performed by discarding, for each model size, the parameters combinations that do not lead to the lowest NMSE for that size. The minimum NMSE data is reported in plot 500b of FIG. 5B. This sets a benchmark for the sequential sweep method in order to evaluate its ability in predicting the model size and parameters that will lead to satisfactory accuracy.

Figure 6:
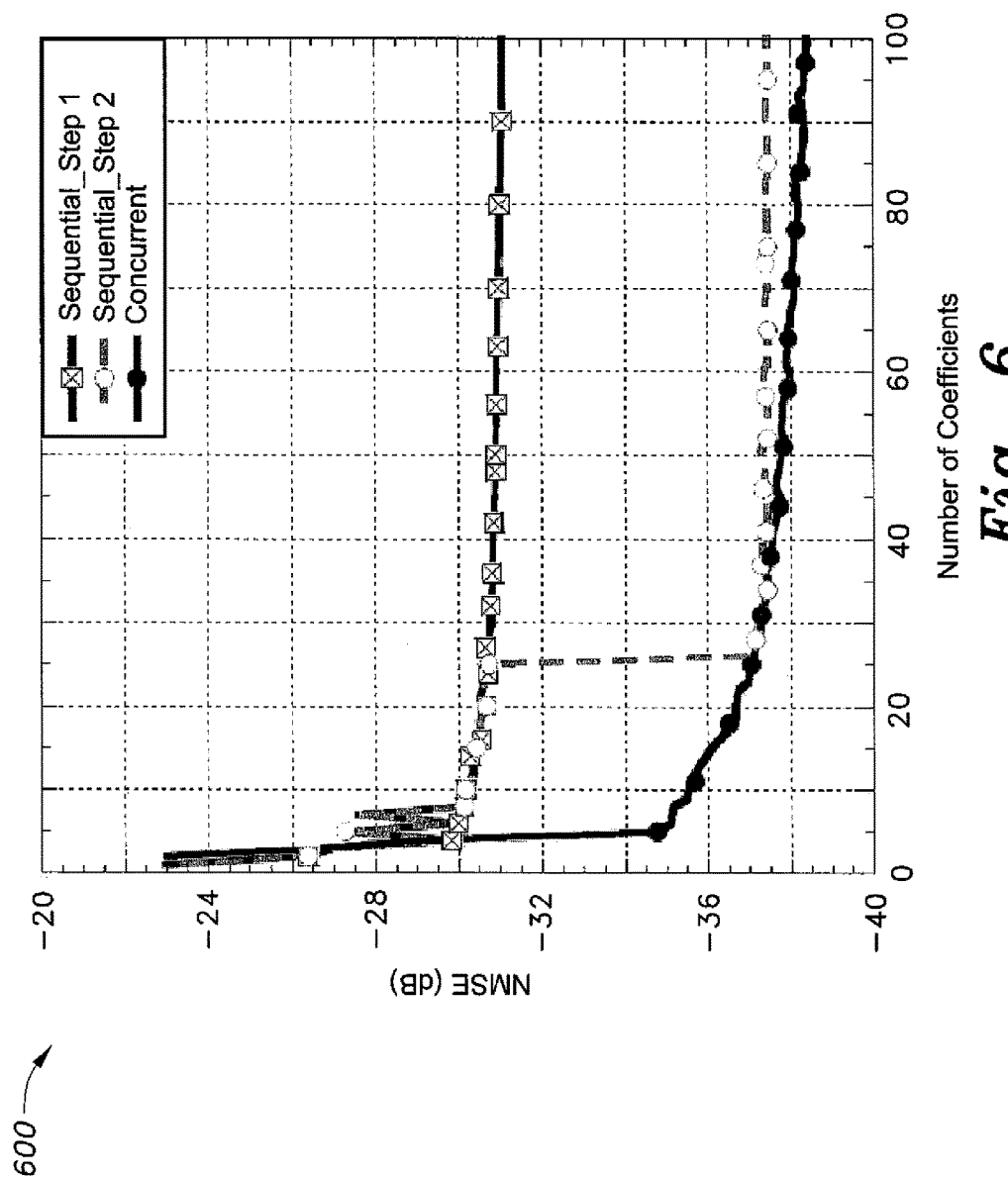
FIG. 6 is a plot illustrating NMSE results of the sequential sweep approach.
Figure 7:
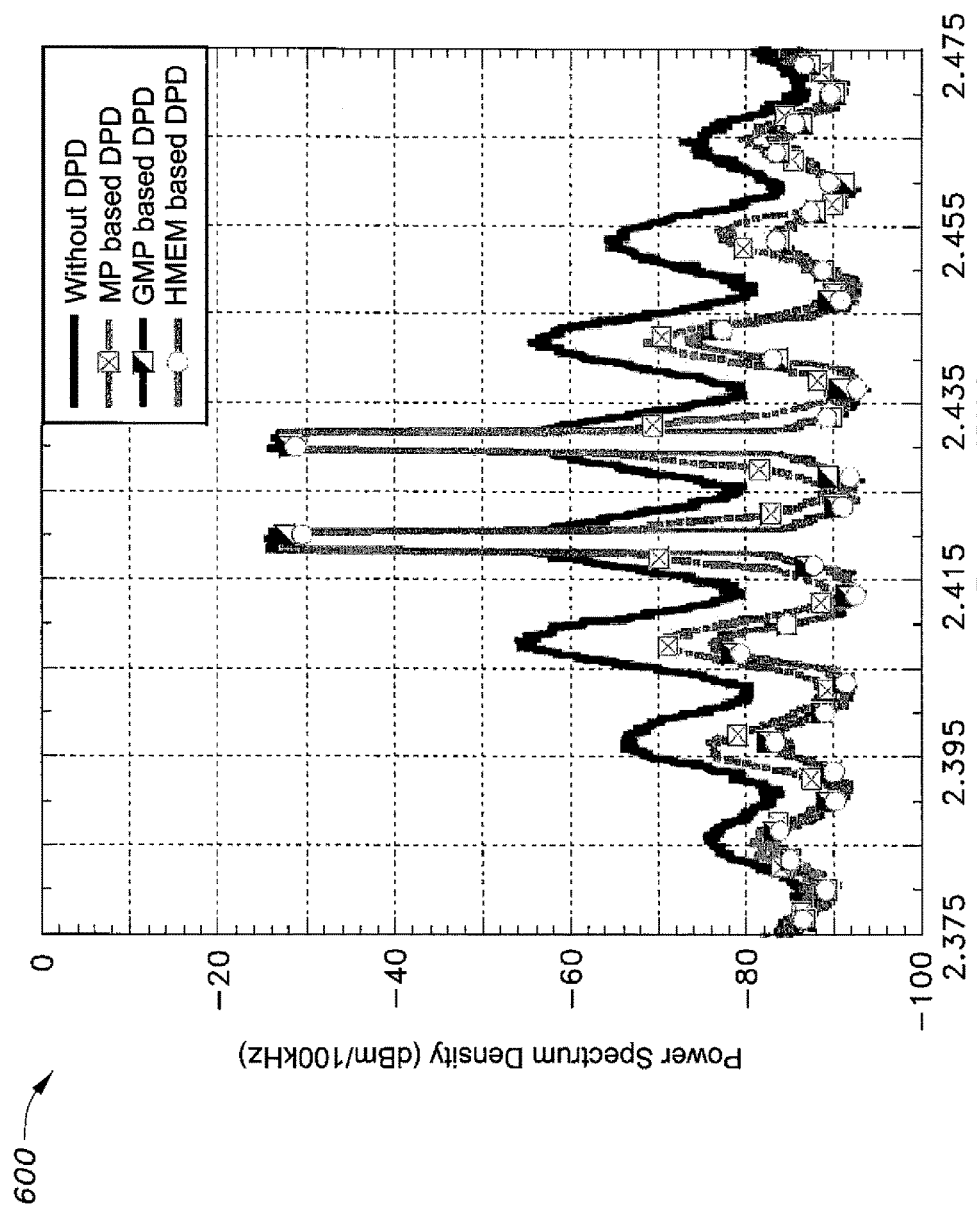
FIG. 7 is a plot illustrating measured spectra at the output of the linearized amplifier.

The sequential sweep technique was then implemented. In the first step, the nonlinearity order (N) and memory depth (M) of the memory polynomial sub-function of the HMEM were concurrently swept from 1 to 10. Then, for each total number of coefficients, the pair of nonlinearity order and memory depth that leads to be best possible NMSE was extracted. The best NMSE as a function of the number of coefficients during the first step of the sequential approach is reported in plot 600 of FIG. 6. The gradient of the best NMSE was used to extract the values of the MP sub-function parameters that lead to satisfactory performance. From this step, the nonlinearity order and the memory depth of the MP sub-function were set to 5 and 5, respectively, i.e., ($N_{MP}$=5 and $M_{MP}$=5). It is worth mentioning here that the MP sub-function parameters were fixed, but not its coefficients. The MP sub-function was then augmented by the envelope memory polynomial sub-function, in which the nonlinearity order ($N_E$) and memory depth ($M_E$) were concurrently swept from 1 to 10. Similar to what was performed during the first step, the NMSE was calculated for each combination of $N_E$ and $M_E$, and the combinations leading to the lowest NMSE were kept. The NMSE variation as a function of the number of coefficients during the second step of the sequential approach is plotted in FIG. 6. The best NMSE obtained from the concurrent sweep technique is also reported in the same Figure as a function of the number of coefficients. This clearly shows the effect of augmenting the memory polynomial sub-function with the envelope memory polynomial part, and the resulting NMSE enhancement. Moreover, one can see that the performance of the model derived from the sequential approach is comparable to that of the models derived from the concurrent approach. However, the sequential approach requires a significantly lower number of iterations and is much more resource efficient. Since the main objective is to linearize the DUT using digital predistortion technique, the nonlinearity orders and memory depths of the model derived in the previous step were used to synthesize a digital predistortion function based on the $p^{th}$ order post-inverse theory. Three twin-nonlinear two-box-based predistorters were tested. In these predistorters, the dynamic distortions circuit block was implemented using MP, GMP, and HMEM functions, respectively. The measured spectra at the output of the linearized amplifier are presented in plot 700 of FIG. 7. Plot 700 shows that the GMP- and HMEM-based predistorters perform similarly, and both outperform the MP-based predistorter.

It is to be understood that the present invention is not limited to the embodiments described above, but encompasses any and all embodiments within the scope of the following claims.

We claim:

1. A behavioral model of a nonlinear power amplifier, comprising:
   a first module implementing a highly nonlinear static behavior of the power amplifier, the first module having an input and an output;
   a second module implementing dynamic distortion behaviors of the power amplifier using a hybrid memory polynomial envelope memory polynomial function defined by a combination of a memory polynomial and an envelope memory polynomial, the second module having an input and an output, the first module being coupled to the second module; and a behavioral model size estimation module sequentially computing an estimated behavioral model size using a formula characterized by $S_{HMEM}=(N \times M)+(N_E \times M_E)$, where N and M represent the nonlinearity order and memory depth of the memory polynomial sub-function, respectively, and $N_E$ and $M_E$ represent the nonlinearity order and memory depth of the envelope memory polynomial sub-function, respectively.

2. The behavioral model according to claim 1, wherein the behavioral model size estimation module further comprises:
means for setting a first dynamic distortions function to a memory polynomial model;
means for sweeping N and M to evaluate the memory polynomial model size;
means for setting $N=N_{MP}$ and setting $M=M_{MP}$;
means for setting a second dynamic distortions function to the hybrid memory polynomial model;
means for sweeping $N_E$ and $M_E$ to evaluate the envelope memory polynomial model size; and
means for setting model parameters to $N=N_{MP}$ and $M=M_{MP}$, $N_E=N_{EMP}$ and $M_E=M_{EMP}$.

3. The behavioral model according to claim 2, further comprising means for extracting the values of the memory polynomial and the envelope memory polynomial sub-function parameters leading to accurate modeling of the power amplifier distortions.

4. The behavioral model according to claim 3, further comprising means for performing a computation of an output $x_{out\_DD}(n)$ of the dynamic distortion behaviors, the computation being characterized by:

$$x_{out_{DD}}(n) = \sum_{j=1}^{M}\sum_{i=1}^{N} a_{ji} \cdot x_{in_{DD}}(n+1-j) \cdot |x_{in_{DD}}(n+1-j)|^{i-1} + \sum_{j=1}^{M_E}\sum_{i=1}^{N_E} b_{ji} \cdot x_{in\_DD}(n) \cdot |x_{in\_DD}(n+1-j)|^{i-1},$$

where $a_{ji}$ are time aligned model coefficients, and $b_{ji}$ are lagging cross-terms model coefficients.

5. The behavioral model according to claim 3, wherein the means for extracting further comprises for each total number of coefficients, means for calculating the combination of nonlinearity order ($N_E$) and memory depth ($M_E$) leading to the best possible NMSE between the model's predicted output and a desired output of the power amplifier, wherein NMSE is characterized by:

$$NMSE_{dB} = 10\log_{10} \sqrt{\frac{\sum_{l=1}^{L}|x_{out\_meas}(l) - x_{out\_DD}(l)|^2}{\sum_{l=1}^{L}|x_{out\_meas}(l)|^2}},$$

where $x_{out\_meas}$ and $x_{out\_DD}$ are measured and estimated baseband output waveforms at the output of the power amplifier, respectively, and L is the number of samples in the output waveform.

6. A predistorter for reducing nonlinearity in a power amplifier, the predistorter comprising:
a first circuit for implementing a highly nonlinear static predistortion function of the power amplifier, the first circuit having an input and an output; and a second circuit for implementing a dynamic distortion predistortion function of the power amplifier using a hybrid memory polynomial envelope memory polynomial function defined by a combination of a memory polynomial and an envelope memory polynomial, the second circuit having an input and an output, the first circuit being connected to the second circuit in cascade for producing a predistortion signal input to the power amplifier compensating for nonlinear distortion behavior of the power amplifier and producing a linear output from the power amplifier; and
means for sequentially computing an estimated predistortion function size using a formula characterized by $S_{HMEM}=(N \times M)+(N_E \times M_E)$, where N and M represent nonlinearity order and memory depth of a sub-function of the memory polynomial, respectively, and $N_E$ and $M_E$ represent nonlinearity order and memory depth of a sub-function of the envelope memory polynomial, respectively.

7. The predistorter according to claim 6, wherein said means for sequentially computing further comprises:
means for setting a first dynamic distortions function to a memory polynomial model;
means for sweeping N and M to evaluate the memory polynomial model size;
means for setting $N=N_{MP}$ and setting $M=M_{MP}$;
means for setting a second dynamic distortions function to a hybrid memory polynomial model;
means for sweeping $N_E$ and $M_E$ to evaluate the envelope memory polynomial model size; and
means for setting model parameters to $N=N_{MP}$ and $M=M_{MP}$, $N_E=N_{EMP}$ and $M_E=M_{EMP}$.

8. The predistorter according to claim 7, further comprising means for extracting values of the memory polynomial and the envelope memory polynomial sub-function parameters leading to linear performance of the power amplifier.

9. The predistorter according to claim 8, further comprising means for performing a computation of an output $x_{out\_DD}(n)$ of the dynamic distortion function, the computation being characterized by:

$$x_{out_{DD}}(n) = \sum_{j=1}^{M}\sum_{i=1}^{N} a_{ji} \cdot x_{in_{DD}}(n+1-j) \cdot |x_{in_{DD}}(n+1-j)|^{i-1} + \sum_{j=1}^{M_E}\sum_{i=1}^{N_E} b_{ji} \cdot x_{in\_DD}(n) \cdot |x_{in\_DD}(n+1-j)|^{i-1},$$

where $a_{ji}$ are time aligned dynamic distortion function coefficients, and $b_{ji}$ are lagging cross-terms dynamic distortion function coefficients.

10. The predistorter according to claim 8, wherein the means for extracting further comprises for each total number of coefficients, means for calculating the combination of nonlinearity order ($N_E$) and memory depth ($M_E$) leading to the best possible NMSE between the predistorter's predicted output and a desired output of the predistorter, the NMSE being characterized by:

$$NMSE_{dB} = 10\log_{10} \sqrt{\frac{\sum_{l=1}^{L}|x_{out\_meas}(l) - x_{out\_DD}(l)|^2}{\sum_{l=1}^{L}|x_{out\_meas}(l)|^2}},$$

where $x_{out\_meas}$ and $x_{out\_DD}$ are desired and estimated baseband output waveforms, respectively, at the output of the predistorter and L is the number of samples in the output waveform.

* * * * *